(12) United States Patent
Honjo

(10) Patent No.: US 6,396,348 B1
(45) Date of Patent: May 28, 2002

(54) CIRCUIT FOR DEALING WITH HIGHER HARMONICS AND CIRCUIT FOR AMPLIFYING POWER EFFICIENCY

(75) Inventor: Kazuhiko Honjo, Tokyo (JP)

(73) Assignee: NEC Corporation, Tokyo (JP)

( * ) Notice: Subject to any disclaimer, the term of this patent is extended or adjusted under 35 U.S.C. 154(b) by 48 days.

(21) Appl. No.: 09/679,620

(22) Filed: Oct. 5, 2000

(30) Foreign Application Priority Data

Oct. 6, 1999 (JP) .......................................... 11-284983

(51) Int. Cl.$^7$ ................................................ H03F 3/60
(52) U.S. Cl. ......................... 330/286; 330/302; 333/33
(58) Field of Search ............................. 333/33, 34, 35, 333/263; 330/286, 302

(56) References Cited

U.S. PATENT DOCUMENTS

| 5,352,990 | A | * | 10/1994 | Goto | .......................... | 330/286 |
| 5,473,281 | A | * | 12/1995 | Honjo | ........................ | 330/286 |

FOREIGN PATENT DOCUMENTS

| JP | 11-52483873 | 9/1993 |
| JP | 11-88459 | 1/1996 |
| JP | 11-2513146 | 4/1996 |
| JP | 11-2616464 | 3/1997 |

* cited by examiner

*Primary Examiner*—Robert Pascal
*Assistant Examiner*—Stephen E. Jones
(74) *Attorney, Agent, or Firm*—Whitham, Curtis & Christofferson, P.C.

(57) ABSTRACT

A circuit connected between an output terminal of an amplification transistor and a resistor for dealing with higher harmonics included in an output signal transmitted from the amplification transistor, includes (a) a first transmission line having an input terminal electrically connected to the output terminal of the amplification transistor, and having a length of $\lambda/4$ wherein $\lambda$ indicates a wavelength of a fundamental harmonic, (b) a first group of transmission lines, including N transmission lines electrically connected in parallel with one another to an output terminal of the first transmission line, wherein N is an integer equal to or greater than 1, each of the N transmission lines having a length L defined by the following equation: $L=\lambda/4(1+M)$ (M=1, 2, 3, - - -, N) each of the N transmission lines having an open end, and (c) a second group of transmission lines, including N transmission lines electrically connected in parallel with one another to an output terminal of the first transmission line, each of the N transmission lines having a length Lh defined by the following equation: $Lh+L=\lambda/2$, each of the N transmission lines having an open end.

22 Claims, 11 Drawing Sheets

CIRCUIT FOR DEALING WITH HIGHER HARMONICS AND CIRCUIT FOR AMPLIFYING POWER EFFICIENCY

BACKGROUND OF THE INVENTION

1. Field of the Invention

The invention relates to a circuit for dealing with higher harmonics and a circuit for amplifying a power efficiency, including the previously mentioned circuit.

2. Description of the Related Art

It is quite important for a radio—communication device driven by power supplied from a cell, such as a cellular phone, to enhance a power efficiency of a transistor amplifier in order to lengthen a period of time in which the device is operable. To this end, active elements in the radio—communication device are designed to be able to operate at a low voltage by reducing a parasitic resistance of a transistor to thereby lower a rise-up voltage as much as possible, and circuits in the radio—communication device are subject to higher harmonic treatment to reduce power loss at higher harmonics.

In general, when a transistor is biased to B-grade, an output current includes a fundamental harmonic having a frequency $f_o$ and M-th order higher harmonics having a frequency $2f_0, 4f_0, 6f_0, \text{-}\text{-}\text{-}$, and $Mf_0$, wherein M is an even number.

Hence, for instance, Japanese Patent No. 2513146 has suggested a power amplifying circuit to reduce power loss caused by higher harmonics, to zero. In the suggested circuit, a load impedance exerting on an output terminal of a transistor is short-circuited at M-th order higher harmonics, so that M-th order voltage higher harmonics cannot exist, and the load impedance is released at N-th higher harmonics, so that only voltage higher harmonics can exist, wherein N is an odd number.

Most of usually used amplification circuits are designed to include a load circuit as illustrated in FIG. 1, which does not carry out dealing with higher harmonics. If the circuit suggested in Japanese Patent No. 2513146 is applied to the circuit illustrated in FIG. 1, a load circuit or a circuit for dealing with higher harmonics, as illustrated in FIG. 2, could be obtained.

The circuit illustrated in FIG. 1 is comprised of an output terminal C of an amplification transistor (not illustrated), a resistor $R_0$ grounded at one end and having a resistance of 50 ohms, an input terminal B of the resistor $R_0$, a first transmission line T11, and a second transmission line T12. The first and second transmission lines T11 and T12 are electrically connected in series to each other between the output terminal C and the input terminal B.

The first transmission line T11 has a length of $\lambda/4$ wherein $\lambda$ indicates a wavelength of a signal to be amplified, that is, a fundamental harmonics, and a resistance of 70 ohms. The second transmission line T12 has a length of $\lambda/4$, and a resistance of 32 ohms. Herein, it is assumed that the fundamental harmonics has a frequency of $f_0$.

The second transmission line T12 has a function of converting an impedance a fundamental harmonics. The illustrated circuit has a load impedance ZL in view of the input terminal C.

The first transmission line T11 having a length of $\lambda/4$ would have a length of $\lambda_2/2$ wherein $\lambda_2$ indicates a wavelength of a second-order higher harmonics. Hence, an impedance of the second-order higher harmonics at the output terminal C is short-circuited, and resultingly, becomes zero. The first transmission line T11 having a length of $\lambda/4$ would have a length of $3\lambda_3/4$ wherein $\lambda_8$ indicates a wavelength of a third-order higher harmonics. Hence, an impedance of the third-order higher harmonics at the output terminal C is released, and resultingly, becomes infinite ( ). As a result, power loss caused by higher harmonics can be reduced to zero.

The load circuit illustrated in FIG. 1 is effectual to second- and third order higher harmonics, but can not be effectual to fourth- or higher order higher harmonics. Hence, the circuit as disclosed in Japanese Patent No. 2513146 has been suggest in order to solve this problem.

FIG. 2 is a circuit diagram of the circuit suggested in Japanese Patent No. 2513146. The illustrated circuit is comprised of an output terminal C of an amplification transistor (not illustrated), a resistor $R_0$ grounded at one end and having a resistance of 50 ohms, an input terminal B of the resistor $R_0$, a first transmission line T11, a second transmission line T12, and a plurality of transmission lines T2 to T7 electrically connected in parallel with one another to a connection point A between the first and second transmission lines T11 and T12.

The first and second transmission lines T11 and T12 are electrically connected in series to each other between the output terminal C and the input terminal B.

The first transmission line T11 has a length of $\lambda/4$ wherein $\lambda$ indicates a wavelength of a signal to be amplified, that is, a fundamental harmonics, and a resistance of 70 ohms. The second transmission line T12 has a length of $\lambda/4$, and a resistance of 32 ohms.

Each of the transmission lines T2 to T7 has an open end, and has a length defined by the following equation:

$$L = \lambda/4(1+M) (M=1, 2, 3, \text{-}\text{-}\text{-}, N).$$

That is, the circuit illustrated in FIG. 2 further includes the transmission lines T2 to T7 in comparison with the circuit illustrated in FIG. 1.

The transmission line T2 corresponding to M=1 has a length of $\lambda/8$, and hence, the second-order higher harmonics is short-circuited at a connection-A through which the first and second transmission lines T11 and T12 are connected.

The transmission line T3 corresponding to M=2 has a length of $\lambda/12$, and hence, the third-order higher harmonics is also short-circuited at the connection A.

As is readily understood to those skilled in the art, the circuit illustrated in FIG. 2 is also effectual to the fourth- or more order higher harmonics. Hence, by arranging the circuit between the output terminal C of a transistor acting as an amplifier and the resistor $R_0$, there can be accomplished an amplification circuit having a high efficiency.

The circuit illustrated in FIG. 2 has such a load impedance as illustrated in FIG. 3. As is understood in FIG. 3, the impedance is short-circuited at M-th order higher harmonics, and is released at N-th order higher harmonics wherein M is an even number and N is an odd number.

However, comparing the load impedance illustrated in FIG. 3 to a load impedance of the circuit illustrated in FIG. 1, illustrated in FIG. 4, it is understood that the impedance of the fundamental harmonics $f_0$ is deviated. This is because a reactance at a fundamental harmonics, of the added stubs, that is, the transmission lines T2 to T7 is residual. The residual reactance causes that a phase difference between a voltage and a current in a fundamental harmonic is deviated from an ideal difference, that is 180 degrees. This deviation in a phase difference causes power loss at a fundamental harmonics, resulting in that a power efficiency is not improved so much. Specifically, the improvement in a power efficiency is about 10% at greatest, and hence, a load power efficiency is about 70% at greatest.

Japanese Patent No. 2616464 has suggested a power amplifying circuit which allows a high-power transistor carrying out amplification at B-grade bias to supply an output to a transmission line having a certain characteristic impedance. In the suggested circuit, an output terminal of the high-power transistor is electrically connected to the transmission line through an impedance matching circuit having a length of $\lambda/4$ wherein $\lambda$ indicates a wavelength of a fundamental harmonics. A plurality of oscillators electrically connected in series to one another is electrically connected at one ends thereof to a connection at which the impedance circuit is connected to the transmission line. The oscillators are electrically connected at the other ends thereof to an earth electrode. Each of the oscillators resonates to one of the second- or more order higher harmonics, and have a reactance greater than the certain characteristic impedance at a fundamental frequency.

Japanese Unexamined Patent Publication No. 6-243873 has suggested an amplifier including an open stub having a length of $\lambda/8$ wherein $\lambda$ indicates a wavelength of a fundamental harmonics, and an inductor grounded at one end. Both the open stub and the inductor are electrically connected to an output terminal of an amplifying device. The open stub and the inductor resonate in parallel for a fundamental harmonics.

Japanese Patent Publication No. 8-8459 has suggested a power amplifier including an active element, a first line having a length of $M \times \lambda/4$ wherein M is an odd number, an oscillation circuit which resonates with a frequency of a fundamental harmonics. The active element is made carry out switching action, and resultingly, there are generated rectangular waves. The first line and the oscillation circuit are connected in series between an output terminal of the active element and an earth such that a fundamental harmonics having a wavelength of $\lambda$ is obtained from the rectangular waves. Two second lines each having a length of $\lambda/8$ are connected at one ends thereof to a connection point at which the first line is connected to the oscillation circuit. One of the second lines is open at the other end thereof, and the other of the second lines is grounded at the other end.

However, the above—mentioned problems that residual reactance is generated by the added parallel stubs and that a power efficiency cannot be enhanced so much remain unsolved even by the above—mentioned Publications.

SUMMARY OF THE INVENTION

In view of the above—mentioned problems in the conventional circuits, it is an object of the present invention to provide a circuit for dealing with higher harmonics which circuit is capable of avoiding generation of residual reactance caused by added parallel stubs.

It is also an object of the present invention to provide a power amplifying circuit which is capable of enhancing a load power efficiency.

In one aspect of the present invention, there is provided a circuit connected between an output terminal of an amplification transistor and a resistor for dealing with higher harmonics included in an output signal transmitted from the amplification transistor, including (a) a first transmission line having an input terminal electrically connected to the output terminal of the amplification transistor, and having a length of $\lambda/4$ wherein $\lambda$ indicates a wavelength of a fundamental harmonic, (b) a first group of transmission lines, including N transmission lines electrically connected in parallel with one another to an output terminal of the first transmission line, wherein N is an integer equal to or greater than 1, each of the N transmission lines having a length L defined by the following equation: $L=\lambda/4 (1+M) (M=1, 2, 3, ---, N)$, each of the N transmission lines having an open end, and (c) a second group of transmission lines, including N transmission lines electrically connected in parallel with one another to an output terminal of the first transmission line, each of the N transmission lines having a length Lh defined by the following equation: $Lh+L=\lambda/2$, each of the N transmission lines having an open end.

It is preferable that the length Lh is defined by the following equation:

$$Lh=\lambda(1+2M)/4(1+M).$$

It is preferable that the circuit further includes a second transmission line having a length of $\lambda/4$ and located between an output terminal of the first transmission line and the resistor.

It is preferable that each of the first group of transmission lines is arranged in symmetry with each of the second group of transmission lines in a lengthwise direction of the first transmission line.

It is preferable that each of the first group of transmission lines and each of the second group of transmission lines extend from the same point.

It is preferable that each of the first group of transmission lines and each of the second group of transmission lines radially extend from the same point.

It is preferable that each of the first group of transmission lines radially extend from the same point on one of sides of the first transmission line and each of the second group of transmission lines radially extend from the same point on the other side of the first transmission line.

In another aspect of the present invention there is provided an amplification circuit including (a) an amplification transistor, and (b) the above—mentioned circuit which deals with higher harmonics included in an output signal transmitted from the amplification transistor.

It is preferable that the amplification transistor has a maximum oscillation frequency 3 N or more times equal to or greater than a frequency of the fundamental harmonics.

It is preferable that the amplification circuit further includes a third transmission line having a wavelength of $\lambda/4$ and electrically connected in series to a base of the amplification transistor.

It is preferable that the amplification circuit further includes a first coupling capacitor located upstream of the third transmission line and electrically connected in series to the third transmission line for prohibiting a direct current to flow therethrough.

It is preferable that the amplification circuit further includes a second coupling capacitor located downstream of the second transmission line and electrically connected in series to the second transmission line for prohibiting a direct current to flow therethrough.

For instance, the amplification transistor may be selected from a heterojunction bipolar transistor (HBT), a high electron mobility transistor (HEMT), a Si-MOSFET or a GaAs FET.

The advantages obtained by the aforementioned present invention will be described hereinbelow.

In accordance with the present invention, it is possible to eliminate residual reactance caused by parallel stubs with optimal conditions to a fundamental harmonics being maintained. Hence, it would be possible to ideally deal with higher harmonics, ensuring a high power efficiency.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 5:
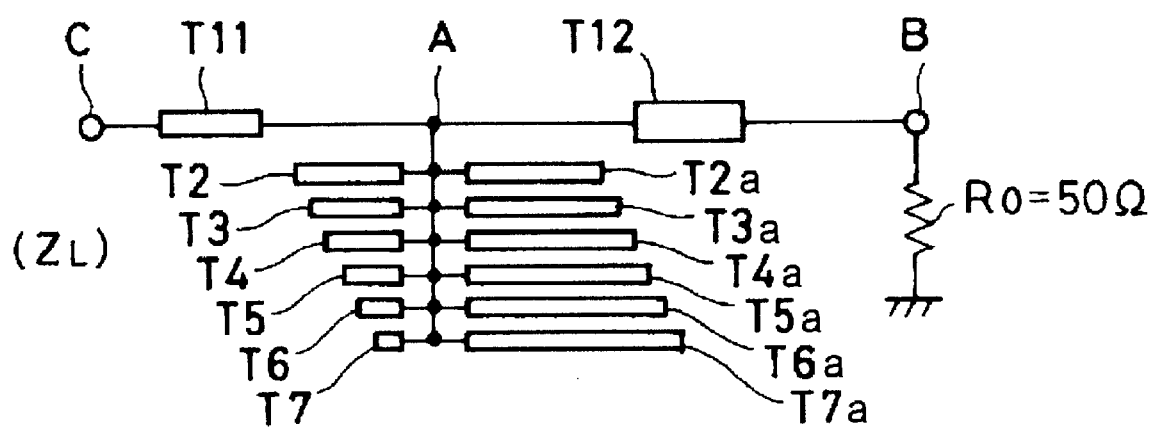
FIG. 5 is a circuit diagram of a circuit equivalent to a circuit for dealing with higher harmonics, in accordance with an embodiment of the present invention.

FIG. 5 is a circuit diagram of a load circuit used in a circuit for amplifying a power efficiency, in accordance with the preferred embodiment of the present invention.

The circuit in accordance with the embodiment is comprised of an output terminal C of an amplification transistor (not illustrated), a resistor $R_0$ grounded at one end and having a resistance of 50 ohms, an input terminal B of the resistor $R_0$, a first transmission line T11, a second transmission line T12, a first group of transmission lines T2 to T7 electrically connected in parallel with one another to a connection point A between the first and second transmission lines T11 and T12, and a second group of transmission lines T2a to T7a electrically connected in parallel with one another to the connection point A.

The first and second transmission lines T11 and T12 are electrically connected in series to each other between the output terminal C and the input terminal B.

The first transmission line T11 has a length of $\lambda/4$ wherein $\lambda$ indicates a wavelength of a signal to be amplified, that is a fundamental harmonics, and a resistance of 70 ohms. The second transmission line T12 has a length of $\lambda/4$, and a resistance of 32 ohms.

Each of the transmission lines T2 to T7 has an open end, and has a length L defined by the following equation:

$$L=\lambda/4(1+M)(M=1, 2, 3, ---, N).$$

Each of the transmission line T2a to T7a has an open end, and has a length Lh defined by the following equation:

$$Lh=\lambda(1+2M)/4(1+M).$$

The first group of transmission lines T2 to T7 is arranged in symmetry with the second group of transmission lines T2a to T7a in a lengthwise direction of the first transmission line T11.

In the present embodiment, N is set equal to 6. However, it should be noted that N might be set equal to any number other than 6.

The stubs T2 to T7 act as parallel stubs having an open end, at frequencies of $2f_0$, $3f_0$, $4f_0$, $5f_0$, $6f_0$ and $7f_0$, respectively. Hence, impedances at the connection point A are all zero at those higher harmonics. The zero impedances at the connection point A would accomplish that the output terminal C of the transistor is short-circuited at M-th order higher harmonics, and is released at N-th order higher harmonics by means of the first transmission line T11 having a length of $\lambda/4$ at a frequency of $f_0$. Herein, M is an even number, and N is an odd number.

Hereinbelow is explained behavior of the transmission lines T2 and T2a as a pair in a fundamental harmonics having a frequency of $f_0$. In a fundamental harmonics, the transmission line T2 has a length of $\lambda/8$ and has an open end, and the transmission line T2a has a length of $3\lambda/8$ and has an open end.

An input admittance Yin of a stub having a length L and having an open end is defined as follows.

$$Yin=J \tan(\beta L)/Z0$$

In this equation Z0 indicates a characteristics impedance of a transmission line, and $\beta$ indicates a phase constant and is equal to $2\pi/\lambda$.

Hence, a parallel input admittance Yp of the transmission lines T2 and T2a in a fundamental harmonics is defined as follows.

$$Y\rho=J[tan(\pi/4)+tan(3\pi/4)]=0$$

This means that the stub pair T2 and T2a does not influence a fundamental harmonics.

Similarly, if a sum of lengths of the transmission lines T3 and T3a, a sum of lengths of the transmission lines T4 and T4a, a sum of lengths of the transmission lines T5 and T5a, a sum of lengths of the transmission lines T6 and T6a, and a sum of length of the transmission lines T7 and T7a are all designed to be equal to $2/\lambda$ wherein $\lambda$ indicates a wavelength of a fundamental harmonics, an input admittance in each of the stub pairs are all equal to zero. This means that all the stub pairs T3 and T3a, T4 and T4a, T5 and T5a, T6 and T6a, and T7 and T7a do not influence a fundamental harmonics at all.

Figure 1:
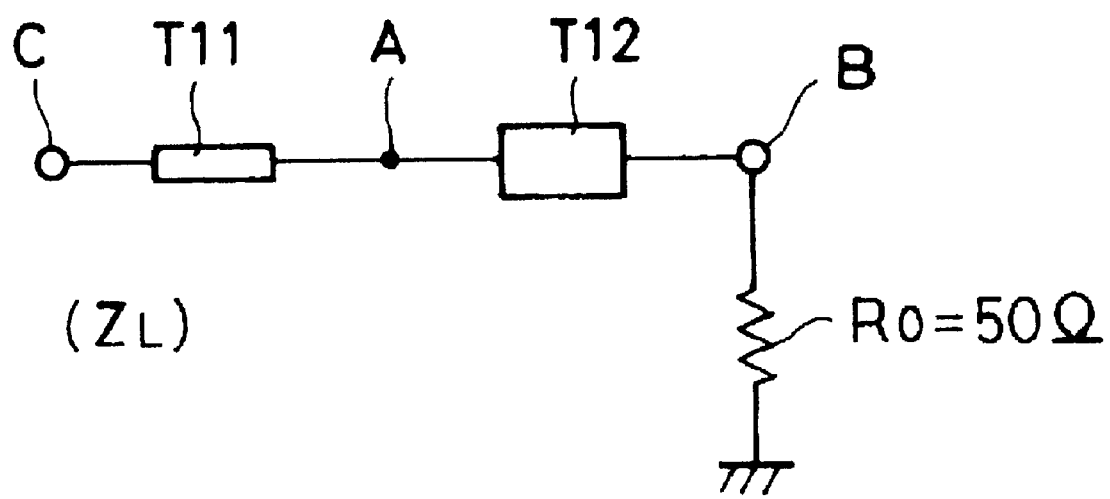
FIG. 1 is a circuit diagram of a load circuit of a transistor in a conventional amplification circuit.
Figure 2:
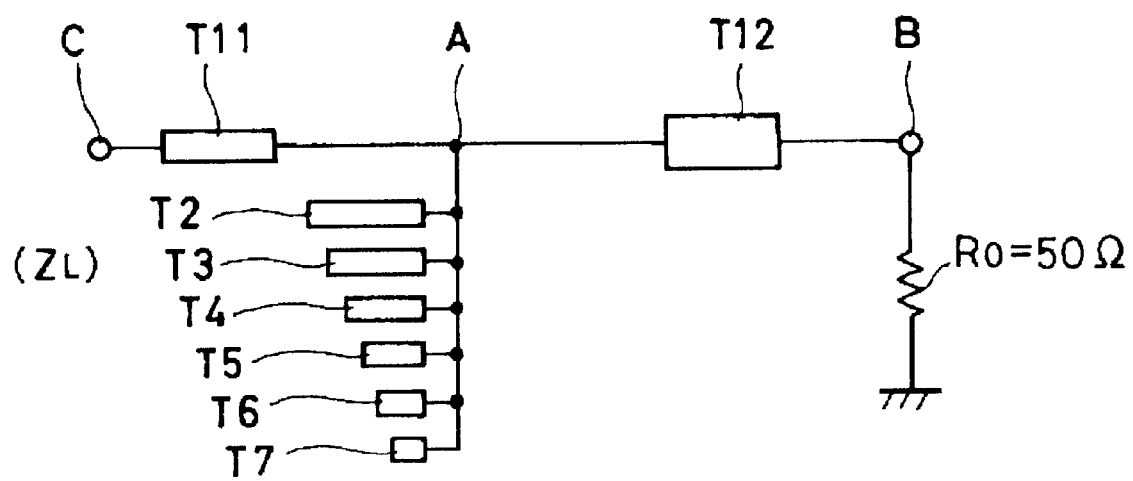
FIG. 2 is a circuit diagram of a load circuit of a transistor in a conventional power amplifying circuit.
Figure 3:
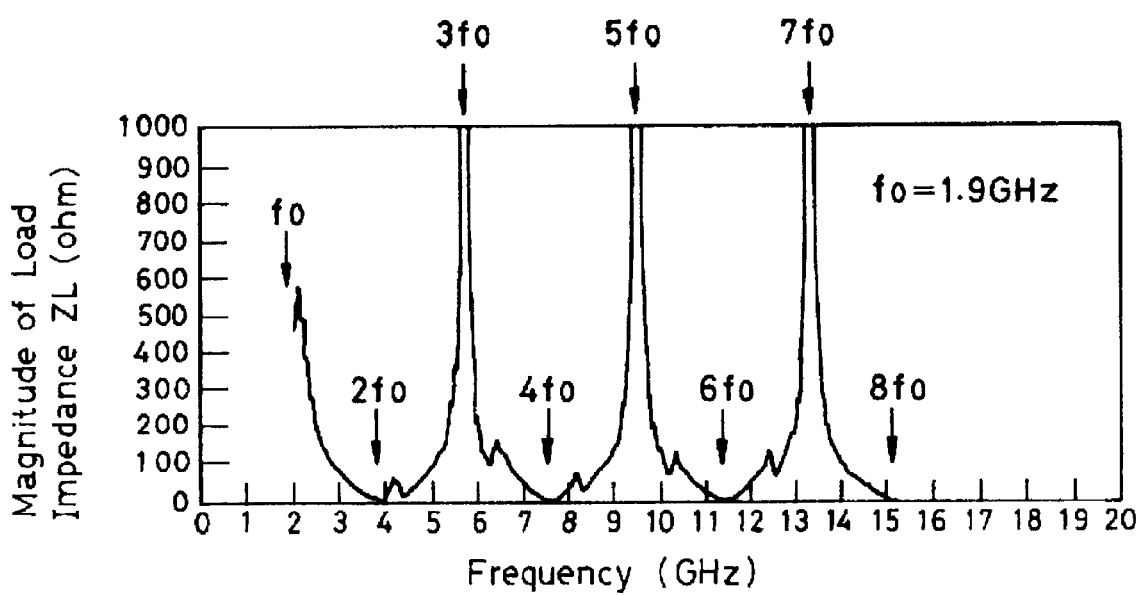
FIG. 3 is a graph showing a relation between a load impedance and a frequency in the circuit illustrated in FIG. 2.
Figure 4:
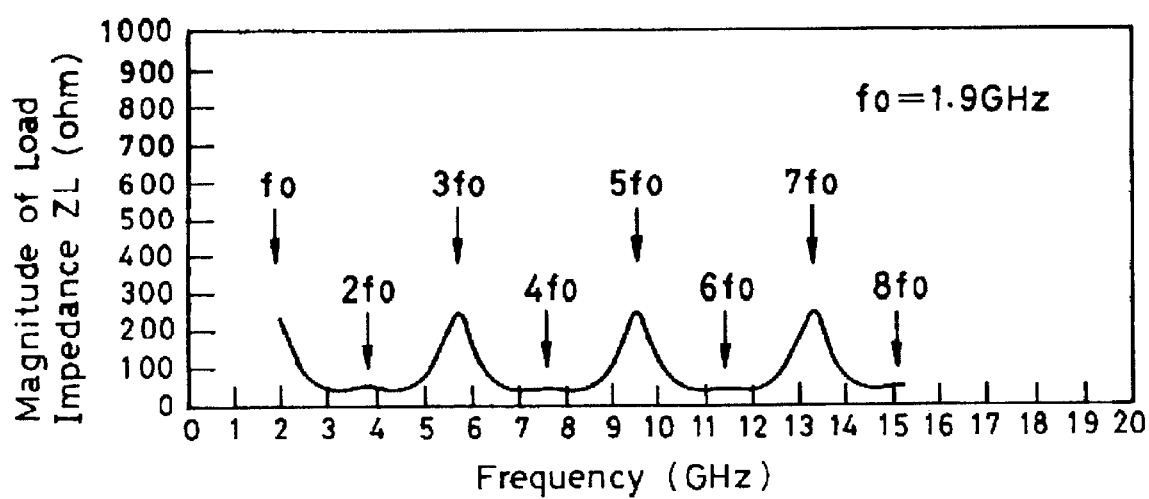
FIG. 4 is a graph showing a relation between a load impedance and a frequency in the circuit illustrated in FIG. 1.
Figure 6:
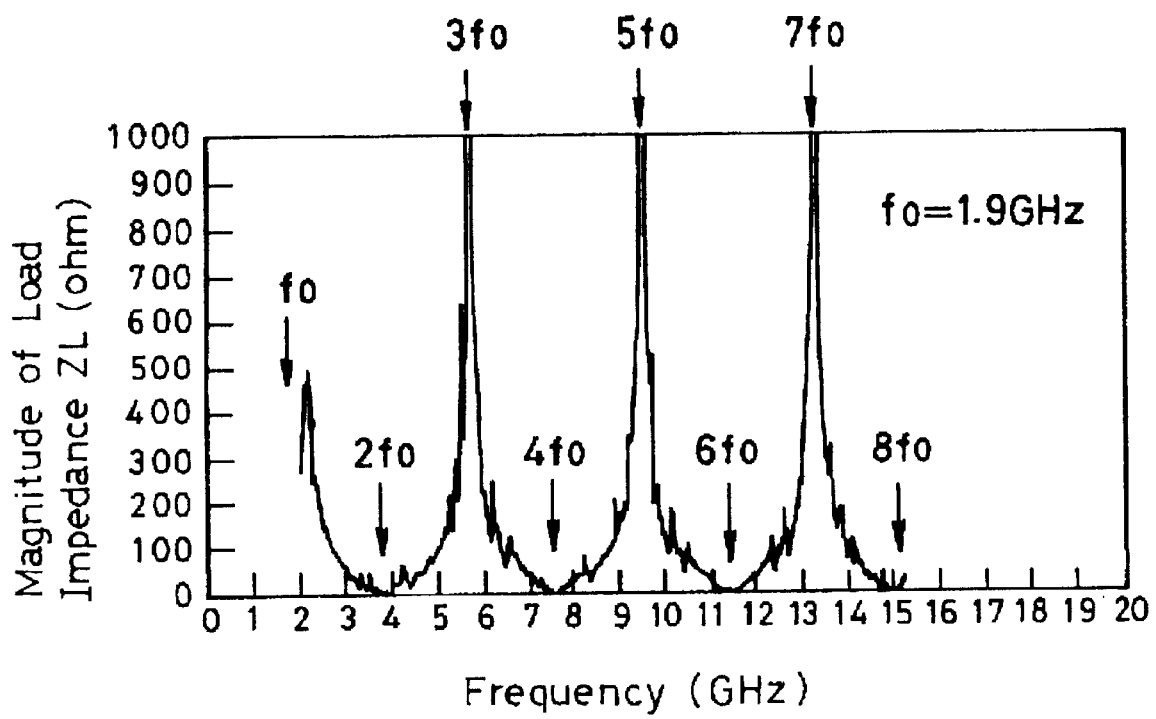
FIG. 6 is a graph showing a relation between a load impedance and a frequency in the circuit illustrated in FIG. 5.

FIG. 6 shows a frequency characteristic of a load impedance of the load circuit in accordance with the embodiment. As illustrated in FIG. 6, the output terminal C is short-circuited at M-th order higher harmonics, and is released at N-th order higher harmonics, and in addition, the impedance found at the frequency $f_0$ is coincident with a load impedance of the conventional circuit illustrated in FIG. 4.

Figure 7:
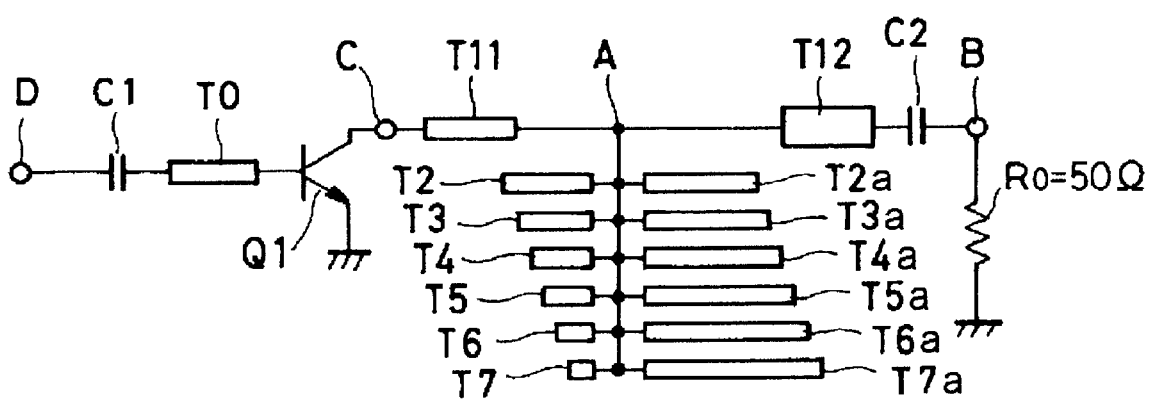
FIG. 7 is a circuit diagram of a circuit for amplifying a power efficiency including the circuit illustrated in FIG. 5.

FIG. 7 is a circuit diagram of an example of application of the circuit in accordance with the embodiment. In this example, the circuit in accordance with the embodiment is applied to a 1.9 GHz bandwidth amplification circuit including a heterojunction bipolar transistor (HBT).

The illustrated circuit is comprised of the circuit illustrated in FIG. 7, a heterojunction bipolar transistor Q1 having a collector electrically connected to the output terminal C and an emitter grounded, a third transmission line T0 electrically connected in series to a base of the transistor Q1 and having a length of $\lambda/4$, a first coupling capacitor C1 electrically connected in series to the third transmission line T0 for prohibiting a direct current to flow therethrough, and a second capacitor electrically connected in series between the second transmission line T12 and the input terminal B of the resistor $R_0$ for prohibiting a direct current to flow therethrough.

The transistor Q1 has a maximum oscillation frequency of 210 GHz, and has a sufficient power gain even in a seventh-order higher harmonics to a frequency of 1.9 GHz. This means that the circuit in accordance with the embodiment works well in the circuit illustrated in FIG. 7.

Figure 8A:
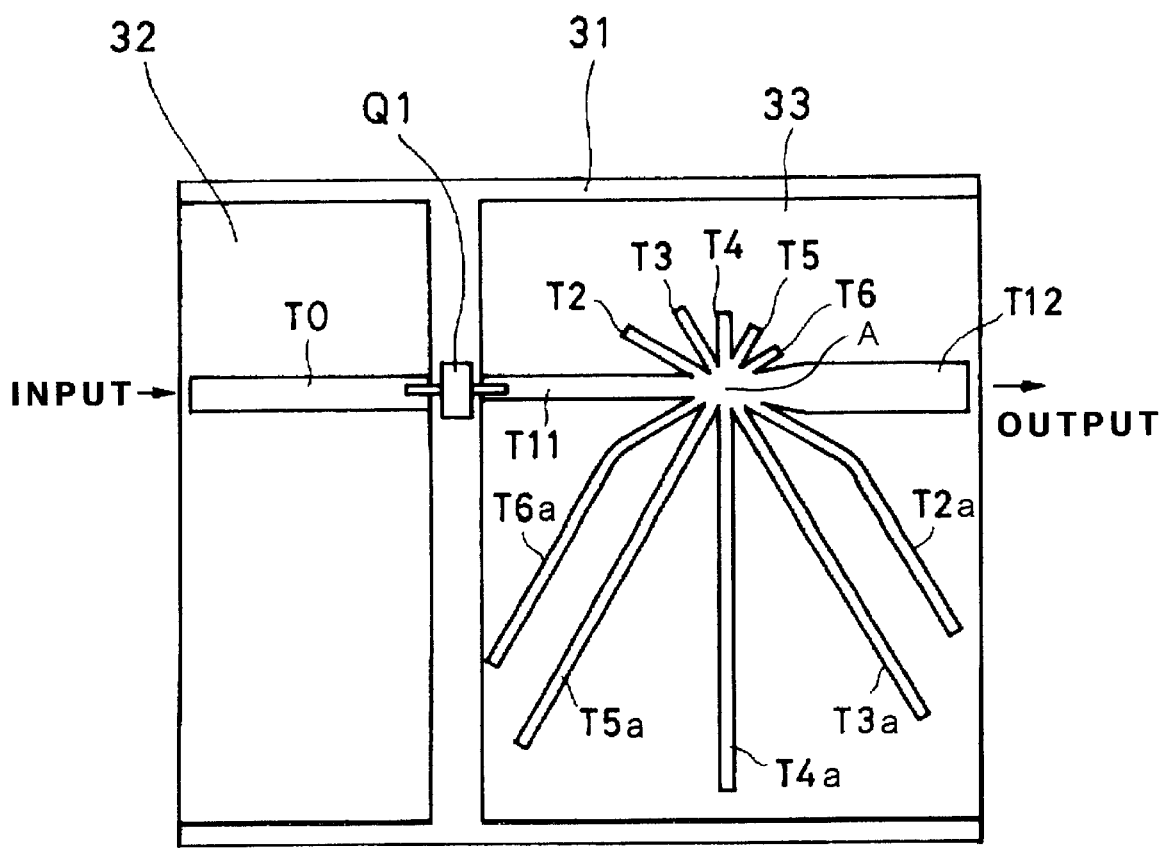
FIG. 8A is a plan view of an example of a layout of a device in which the circuit illustrated in FIG. 5 is mounted.
Figure 8B:
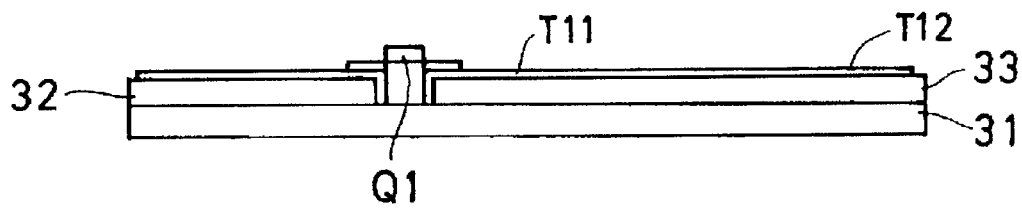
FIG. 8B is a side view of the device illustrated in FIG. 8A.

FIG. 8A is a plan view of an example of a layout of a device in which the circuit in accordance with the embodiment is mounted, and FIG. 8B is a side view of the device.

The illustrated device is comprised of a base block 31 composed of a metal, a first dielectric substrate 32 formed on the base block 31 in a first area, a second dielectric substrate 33 formed on the base block 31 in a second area, an input transmission line T0 formed on the first dielectric substrate 32, a first output transmission line T11 formed on the second dielectric substrate 33, a second output transmission line T12 formed on the second dielectric substrate 33 so that the second dielectric substrate 33 is straightly coupled at a connection point A with the first output transmission line T11, a first group of transmission lines T2 to T6 upwardly radially extending from the connection point A, a second group of transmission lines T2a to T6a downwardly radially extending from the connection point A, and a heterojunction bipolar transistor (HBT) Q1 between the first dielectric substrate 32 and the second dielectric substrate 33 and further between the input transmission line T0 and the first output transmission line T11.

The input transmission line T0 and the first and second output transmission lines T11 and T12 are all composed of a micro-strip electrical conductor.

The arrangement of the first and second groups of transmission lines T2 to T6 and T2a to T6a is not to be limited to the arrangement illustrated in FIG. 8A. They may be arranged in any pattern, unless they extend from the same point.

If a frequency used is equal to or greater than 10 GHz, it would be preferable, from the standpoint of a circuit balance, to arrange two sets of the first group of transmission lines T2 to T6 and two sets of the second group of transmission lines T2a to T6a so that the two sets of the first group of transmission lines T2 to T6 are located in symmetry with the two sets of the second group of transmission lines T2a to T6a about the first and second output transmission lines T11 and T12.

Figure 9:
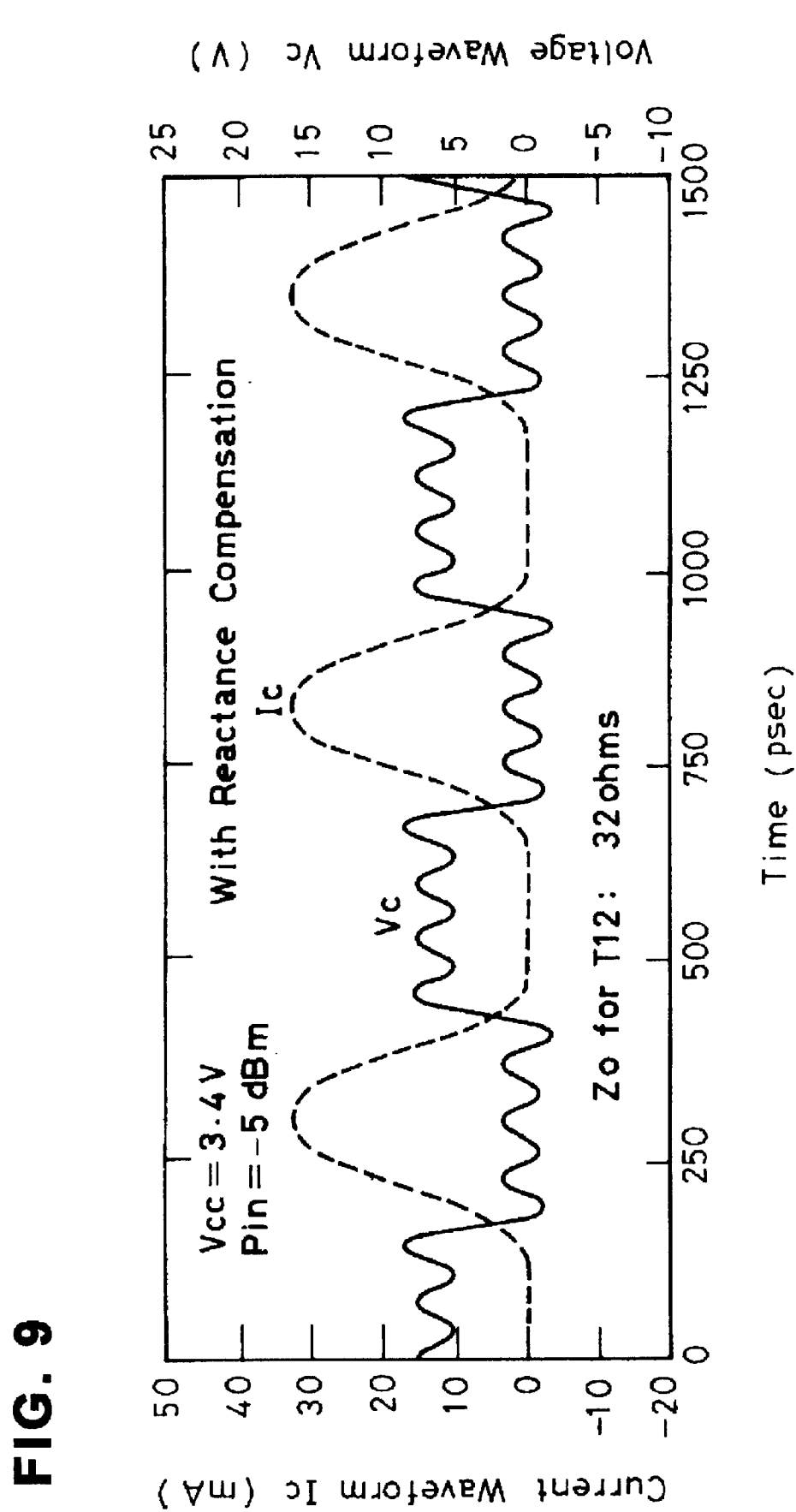
FIG. 9 is a graph showing waveforms of a current and a voltage at an output terminal of a transistor in the circuit illustrated in FIG. 7.

FIG. 9 is a graph showing waveforms of a current and a voltage measured at the output terminal C in the amplification circuit illustrated in FIGS. 8A and 8B, when a power source voltage is 3.4 V. It is understood in view of FIG. 9 that the current waveform seldom overlaps the voltage waveform.

Figure 10:
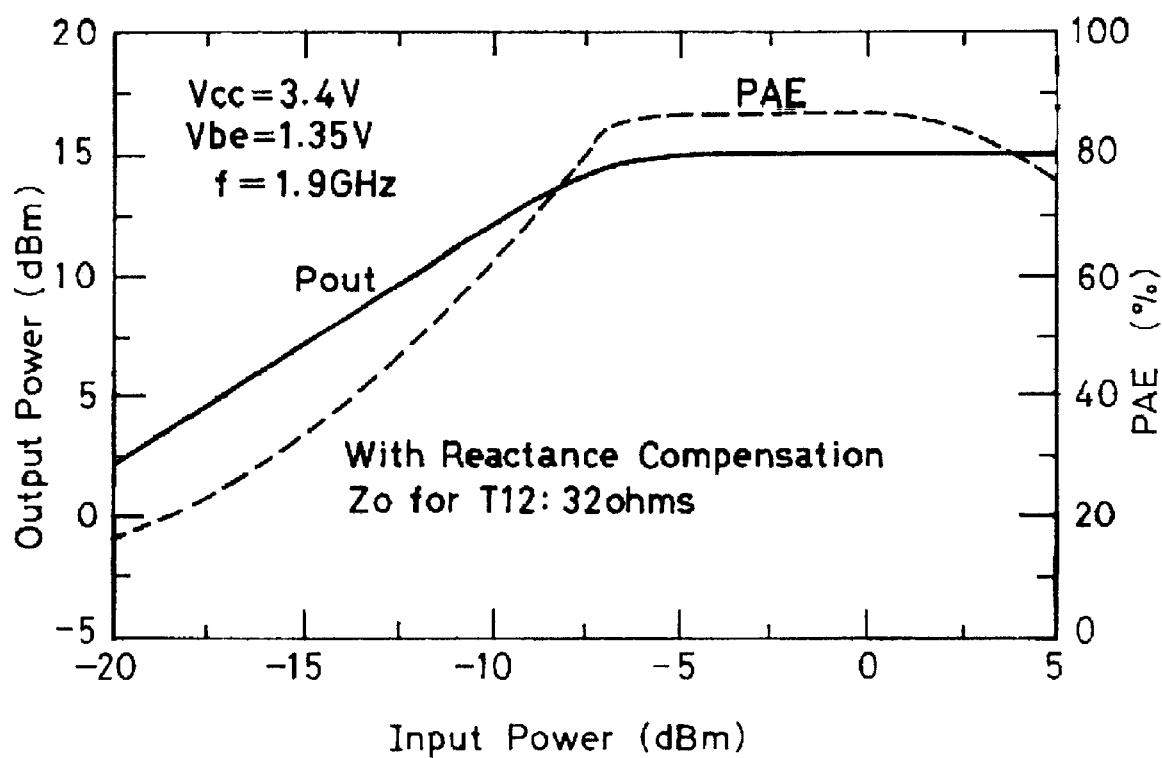
FIG. 10 is a graph showing a load power efficiency (PAE) and an output power (Pout) in the circuit illustrated in FIG. 7.

FIG. 10 is a graph showing a relation between an input power and an output power, and a load power efficiency (PAE) of the circuit illustrated in FIGS. 8A and 8B. The load power efficiency is quite high, specifically, about 88%.

Figure 11:
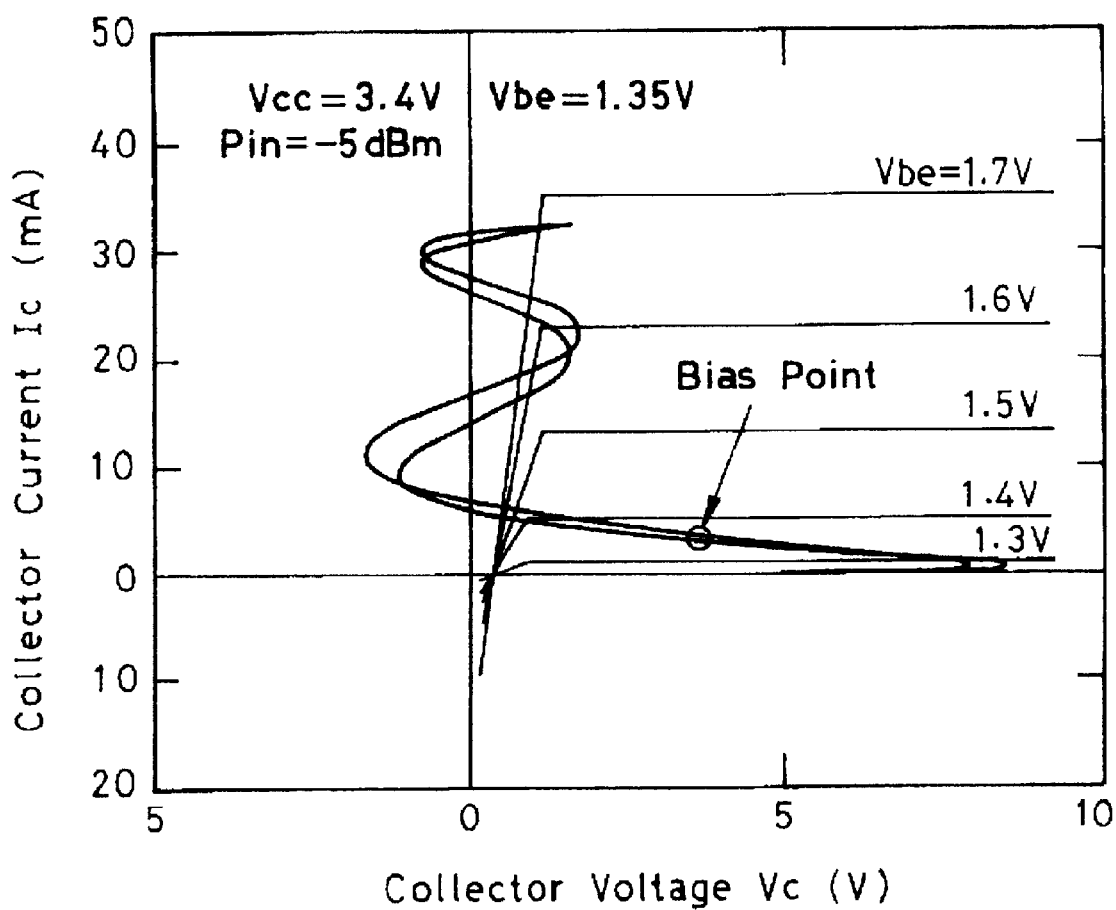
FIG. 11 is a graph showing a dynamic load line in the circuit illustrated in FIG. 7.

FIG. 11 shows a dynamic load characteristic of the transistor Q1. As illustrated in FIG. 11, the dynamic load characteristic of the transistor Q1 is quite different from that of a usual A-grade, B-grade or C-grade circuit. Specifically, when a voltage is applied to the transistor Q1, a current does not flow through the transistor Q1, and when a current flows through the transistor Q1, a voltage is not applied to the transistor Q1.

In addition, the dynamic load line exist at the left of a rise-up point of the current—voltage static characteristic. Hence, it is understood that a high power efficiency can be accomplished even in a transistor which has a great parasitic resistance and accordingly has a poor rise-up characteristic.

If a power source voltage is set equal to 6 V, a load power efficiency would reach about 92%.

As mentioned so far, in accordance with the embodiment, it is possible to deal with higher harmonics with optimal conditions for a fundamental harmonics being maintained. Hence, a quite high power efficiency can be accomplished.

It is preferable that a transistor used have a power gain of 10 dB or greater at a maximum order higher harmonics to be dealt with. To this end, considering a=6 dB/octave characteristic in a power gain of a transistor, it is necessary for $Nf_0$ to be within $\frac{1}{3}$ off$_{max}$.

Though a heterojunction bipolar transistor is used as the transistor Q1 in the example illustrated in FIGS. 8A and 8B, any other transistors may be used as the transistor Q1. For instance, the transistor Q1 may be a high electron mobility transistor (HEMT), a Si-MOSFET or a GaAs FET.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-284983 filed on Oct. 6, 1999 including specification, claims, drawings and summary is incorporated herein by reference in its entirety.

What is claimed is:

1. A circuit connected between an output terminal of an amplification transistor and a resistor for dealing with higher harmonics included in an output signal transmitted from said amplification transistor, comprising:

(a) a first transmission line having an input terminal electrically connected to said output terminal of said amplification transistor, and having a length of $\lambda/4$ wherein $\lambda$ indicates a wavelength of a fundamental harmonic;

(b) a first group of transmission lines, including N transmission lines electrically connected in parallel with one another to an output terminal of said first transmission line, wherein N is an integer equal to or greater than 1, each of said N transmission lines having a length L defined by the following equation:

$$L=\lambda/4(1+M)(M=1, 2, 3, ---, N),$$

each of said N transmission lines having an open end; and (c) a second group of transmission lines, including N transmission lines electrically connected in parallel with one another to an output terminal of said first transmission line, each of said N transmission lines having a length Lh defined by the following equation:

$$Lh+L=\lambda/2,$$

each of sand N transmission lines having an open end.

2. The circuit as set forth in claim 1, wherein said length Lh is defined by the following equation:

$$Lh=\lambda(1+2M)/4(1+M).$$

3. The circuit as set forth in claim 1, further comprising a second transmission line having a length of λ/4 and located between an output terminal of said first transmission line and said resistor.

4. The circuit as set forth in claim 1, wherein each of said first group of transmission lines is arranged in symmetry with each of said second group of transmission lines in a lengthwise direction of said first transmission line.

5. The circuit as set forth in claim 1, wherein each of said first group of transmission lines and each of said second group of transmission lines extend from the same point.

6. The circuit as set forth in claim 5, wherein each of said first group of transmission lines and each of said second group transmission lines radially extend from said same point.

7. The circuit as set forth in claim 5, wherein each of said first group of transmission lines radially extend from said same point on one of sides of said first transmission line and each of said second group of transmission lines radially extend from said same point on the other side of said first transmission line.

8. An amplification circuit comprising:

(a) an amplification transistor; and (b) a circuit which deals with higher harmonics included in an output signal transmitted from said amplification transistor, comprising:

(b1) A first transmission line receiving said output signal transmitted from said amplification transistor, and having a length of λ/4 wherein λ indicates a wavelength of a fundamental harmonic;

(b2) a first group of transmission lines, including N transmission lines electrically connected in parallel with one another to an output terminal of said first transmission line, wherein N is an integer equal to or greater than 1, each of said N transmission lines having a length L defined by the following equation:

$$L=\lambda/4(1+M)(M=1, 2, 3, ---, N)$$

each of said N transmission lines having an open end; and (b3) a second group of transmission lines, including N transmission lines electrically connected in parallel with one another to an output terminal of said first transmission line, each of said N transmission lines having a length Lh defined by the following equation:

$$Lh+L=\lambda/2$$

each of said N transmission lines having an open end.

9. The amplification circuit as set forth in claim 8, wherein said length Lh is defined by the following equation:

$$Lh=\lambda(1+2M)/4(1+M).$$

10. The amplification circuit as set forth in claim 8, wherein said circuit further includes a second transmission line having a length of λ/4 and located between an output terminal of said first transmission line and said resistor.

11. The amplification circuit as set forth in claim 10, further comprising a second coupling capacitor located downstream of said second transmission line and electrically connected in series to said second transmission line for prohibiting a direct current to flow therethrough.

12. The amplification circuit as set forth in claim 8, wherein each of said first group of transmission lines and each of said second group of transmission lines extend from the same point.

13. The amplification circuit as set forth in claim 12, wherein each of said first group of transmission lines and each of said second group of transmission lines radially extend from said point.

14. The amplification circuit as set forth in claim 12, wherein each of said first group of transmission lines radially extend from said point on one of sides of said first transmission line and each of said second group of transmission lines radially extend from said point on the other side of said first transmission line.

15. The amplification circuit as set forth in claim 8, wherein said amplification transistor has a maximum oscillation frequency 8 N or more times equal to or greater than a frequency of said fundamental harmonics.

16. The amplification circuit as set forth in claim 8, further comprising a third transmission line having a wavelength of λ/4 and electrically connected in series to a base of said amplification transistor.

17. The amplification circuit as set forth in claim 16, further comprising a first coupling capacitor located upstream of said third transmission line and electrically connected in series to said third transmission line for prohibiting a direct current to flow therethrough.

18. The amplification circuit as set forth in claim 8, wherein each of said first group of transmission lines is arranged in symmetry with each of said second group of transmission lines in a lengthwise direction of said first transmission line.

19. The amplification circuit as set forth in claim 8, wherein said amplification transistor is a heterojunction bipolar transistor (HBT).

20. The amplification circuit as set forth in claim 8, wherein said amplification transistor is a high electron mobility transistor (HEMT).

21. The amplification circuit as set forth in claim 8, wherein said amplification transistor is a Si-MOSFET.

22. The amplification circuit as set forth in claim 8, wherein said amplification transistor is a GaAsFET.

* * * * *